United States Patent
Hack et al.

(10) Patent No.: US 12,532,626 B2
(45) Date of Patent: Jan. 20, 2026

(54) LONG OPERATIONAL LIFETIME OLED DISPLAY

(71) Applicant: Universal Display Corporation, Ewing, NJ (US)

(72) Inventors: Michael Hack, Carmel, CA (US); Michael Stuart Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 630 days.

(21) Appl. No.: 17/875,499

(22) Filed: Jul. 28, 2022

(65) Prior Publication Data

US 2023/0091777 A1    Mar. 23, 2023

Related U.S. Application Data

(60) Provisional application No. 63/243,251, filed on Sep. 13, 2021.

(51) Int. Cl.
*H01L 21/78* (2006.01)
*H10K 50/80* (2023.01)
(Continued)

(52) U.S. Cl.
CPC ......... *H10K 59/353* (2023.02); *H10K 50/868* (2023.02); *H10K 59/131* (2023.02); *H10K 59/38* (2023.02)

(58) Field of Classification Search
CPC .. H10K 59/353; H10K 50/868; H10K 59/131; H10K 59/38; H10K 50/19;
(Continued)

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| KR | 20170030364 | 3/2017 |
| KR | 20200002458 | 11/2020 |

(Continued)

OTHER PUBLICATIONS

Baldo et al. "Highly efficient phosphorescent emission from organic electroluminescent devices", Nature, vol. 395, pp. 151-154, 1998.
(Continued)

*Primary Examiner* — Vu A Vu
(74) *Attorney, Agent, or Firm* — Butzel Long

(57) ABSTRACT

Embodiments of the disclosed subject matter provide a device having a full-color organic light emitting device (OLED) display having a plurality of pixels, with each pixel having a plurality of sub-pixels and where no individual sub-pixel of the plurality of sub-pixels emits white light. The OLED display may be configured to operate with a luminance of at least 1,000 $cd/m^2$ at the D65 or higher white point, and using not more than a 0.5 $mA/cm^2$ drive current for a blue sub-pixel of the plurality of sub-pixels based on an overall active area of the full-color OLED display.

20 Claims, 13 Drawing Sheets

(51) Int. Cl.
*H10K 59/131* (2023.01)
*H10K 59/35* (2023.01)
*H10K 59/38* (2023.01)

(58) Field of Classification Search
CPC .. H10K 59/32; H10K 59/35; H10K 2102/331; H10K 2102/351; H10K 59/875; G09G 3/3208; G09G 2300/0452; G09G 2330/021; G02B 5/1809
USPC .......................................................... 257/40
See application file for complete search history.

(56) References Cited

U.S. PATENT DOCUMENTS

| | | | |
|---|---|---|---|
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,537,688 B2 | 3/2003 | Silvernail | |
| 6,597,111 B2 | 7/2003 | Silvernail | |
| 6,664,137 B2 | 12/2003 | Weaver | |
| 6,790,540 B2* | 9/2004 | Mori | H10K 85/30 252/301.16 |
| 6,835,950 B2 | 12/2004 | Brown | |
| 6,888,305 B2 | 5/2005 | Weaver | |
| 6,888,307 B2 | 5/2005 | Silvernail | |
| 6,897,474 B2 | 5/2005 | Brown | |
| 7,187,119 B2 | 3/2007 | Weaver | |
| 7,279,704 B2 | 10/2007 | Walters | |
| 7,431,968 B1 | 10/2008 | Shtein | |
| 7,683,534 B2 | 3/2010 | Weaver | |
| 7,968,146 B2 | 6/2011 | Wagner | |
| 9,088,001 B2* | 7/2015 | Kim | H10K 71/00 |
| 9,170,665 B2 | 10/2015 | Hack | |
| 9,252,379 B2* | 2/2016 | Lee | H10K 50/16 |
| 9,312,517 B2* | 4/2016 | Drzaic | H10K 50/865 |
| 9,960,386 B2 | 5/2018 | Thompson | |
| 10,403,854 B2 | 9/2019 | Thompson | |
| 10,529,939 B2* | 1/2020 | Kim | H10K 50/19 |
| 10,673,005 B2* | 6/2020 | Park | H10K 59/12 |
| 10,700,134 B2 | 6/2020 | Hack | |
| 11,139,442 B2 | 10/2021 | Fusella | |
| 11,335,876 B2* | 5/2022 | Seok | H10K 50/11 |
| 2003/0230980 A1 | 12/2003 | Forrest | |
| 2004/0174116 A1 | 9/2004 | Lu | |
| 2017/0229663 A1 | 8/2017 | Tsai | |
| 2021/0249633 A1 | 8/2021 | Fusella | |
| 2021/0265584 A1 | 8/2021 | Fusella | |
| 2021/0296618 A1* | 9/2021 | Levermore | H10K 50/125 |
| 2022/0052278 A1* | 2/2022 | Lee | C07F 15/0033 |
| 2022/0199931 A1* | 6/2022 | Hamer | H10K 59/32 |
| 2023/0017865 A1* | 1/2023 | Park | B60K 35/60 |

FOREIGN PATENT DOCUMENTS

| | | |
|---|---|---|
| WO | 2008057394 A1 | 5/2008 |
| WO | 2010011390 A2 | 1/2010 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Korean Office Action (including English translation) issued in App. No. KR2022-0113371, dated Nov. 13, 2025, 9 pages.

* cited by examiner

FIG. 4A

Example Assumptions

| | |
|---|---|
| Green | 200 cd/A |
| Red | 75 cd/A |
| Blue | 21 cd/A |
| Pixel Capacitance | 2.20E-08 F/cm² |
| OLED Voltage | 4 V |
| Vth | 2.73 V |
| Mob | 10.00 cm²/Vs |
| W/L | 4.00 |
| TFT Gate Capacitance | 0.01 uF/cm² |
| KuW/2L | 0.20 µA |
| TFT Voltage | 3.07 V |
| Polarizer Efficiency | 100% |
| Green Component | 61.1% |
| Red Component | 32.6% |
| Blue Component | 6.3% |
| Green / Pixel Area | 25% |
| Red / Pixel Area | 25% |
| Blue / Pixel Area | 50% |

Example Display Specifications

| | |
|---|---|
| Width | 11.5 cm |
| Height | 5.31 |
| Brightness | 1000 cd/m² |
| Sub-pixel fill factor | 60% |
| Refresh Rate | 60 Hz |
| Display Resolution | 400 ppi |
| Sub-pixel area | 8.06E-06 cm² |

FIG. 4B

Example Calculated Values

| Green Brightness | 4,073 nits |
|---|---|
| Red Brightness | 2,173 nits |
| Blue Brightness | 210 nits |
| | |
| Green Power | 0.176 W |
| Red Power | 0.250 W |
| Blue Power | 0.086 W |
| | |
| Green OLED current | 2.04 mA/cm$^2$ |
| Red OLED current | 2.90 mA/cm$^2$ |
| Blue OLED current | 1.00 mA/cm$^2$ |

Total Power

| | 0.514 W |
|---|---|
| | 8.40 mW/cm$^2$ |

LONG OPERATIONAL LIFETIME OLED DISPLAY

CROSS-REFERENCE TO RELATED APPLICATIONS

This application claims priority to U.S. Patent Application Ser. No. 63/243,251, filed Sep. 13, 2021, the entire contents of which are incorporated herein by reference.

FIELD

The present invention relates to devices and techniques for fabricating organic emissive devices, such as organic light emitting diodes, for displays that have low power consumption and long operational lifetimes by reducing the current density to drive blue sub-pixels, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |

-continued

| Color | CIE Shape Parameters |
|---|---|
| Central Blue | Locus: [0.1746, 0.0052]; [0.0326, 0.3530]; Interior: [0.2268, 0.3321] |
| Central Yellow | Locus: [0.373 1, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may include a full-color organic light emitting device (OLED) display having a plurality of pixels, with each pixel having a plurality of sub-pixels and where no individual sub-pixel of the plurality of sub-pixels emits white light. The OLED display may be configured to operate with a luminance of at least 1,000 cd/m$^2$ at the D65 or higher white point, and using not more than a 0.5 mA/cm$^2$ drive current for a blue sub-pixel of the plurality of sub-pixels based on an overall active area of the full-color OLED display.

The OLED display may be configured to operate with the luminance of at least 1,000 cd/m$^2$ at the D65 or higher white point at a DCI-P3 color gamut, or with greater than 64% of the Rec2020 color gamut.

The drive current to at least one of the plurality of sub-pixels may be pulsed with a duty cycle that is less than 100%.

The plurality of sub-pixels may include at least one blue sub-pixel, and the drive current to the at least one blue sub-pixel may be pulsed with a duty cycle that is less than 100%.

The sub-pixels of the OLED display may include a first blue emissive layer disposed on a second blue emissive layer to form a blue tandem sub-pixel. The drive current of the blue tandem sub-pixel may be less than 0.25 mA/cm$^2$, based on the overall active area of the full-color OLED display, to operate with a luminance of at least 1,000 cd/m$^2$ at the D65 or higher white point.

A resolution of the OLED display may be greater than 400 dpi (dots per inch), and/or greater than 500 dpi.

The plurality of sub-pixels of the device may include blue sub-pixels, green sub-pixels, and red subpixels. A first sub-pixel area that includes the blue sub-pixels may be larger than a second sub-pixel area that includes the green sub-pixels, and/or a third sub-pixel area that includes the red sub-pixels.

The plurality of sub-pixels of the device may include blue sub-pixels, green sub-pixels, and red subpixels. A first sub-pixel area that includes the blue sub-pixels may be larger than a combination of a second sub-pixel area that includes the green sub-pixels and a third sub-pixel area that includes the red sub-pixels.

Each pixel of the plurality of pixels of the device may have no more than three sub-pixels.

Each pixel of the plurality of pixels of the device may have more than three sub-pixels.

The plurality of sub-pixels may include blue sub-pixels, green sub-pixels, and red sub-pixels, and the device may include a circular polarizer disposed over only the red sub-pixels and the green sub-pixels. A color filter may be disposed over the blue sub-pixels.

The device may include a power supply to provide a pulsed power the OLED display at less than a 100% duty cycle when the OLED display is on.

The device may include a first global power supply rail configured to provide steady-state power to the OLED display. A second global power supply rail may be configured to provide pulsed power to the OLED display at less than a 100% duty cycle. The first global power supply rail may provide steady state power to at least one of the plurality of sub-pixels, and the second global power supply provides pulsed power to at least another one of the plurality of sub-pixels.

The OLED display of the device may include a drive TFT (thin film transistor) gate capacitance that is less than $1\times10^{-8}$ F/cm$^2$. A mobility of the drive TFT may be between 1-10 cm$^2$/V*s.

A power consumption of the OLED display may be less than 9 mW/cm$^2$ at equal or greater to D65 white point at 1,000 nits, excluding a driving circuitry power consumption that is external to the active area of the full-color OLED display.

A blue sub-pixel of the plurality of sub-pixels of the device may be shared between at least two pixels of the plurality of pixels.

At least one pixel of the plurality of pixels of the OLED display of the device may include a first blue sub-pixel disposed on a second blue sub-pixel to form a blue tandem sub-pixel, a first green sub-pixel disposed on a second green sub-pixel to form a green tandem sub-pixel, and a first red sub-pixel disposed on a second red sub-pixel to form a red tandem sub-pixel.

At least one sub-pixel of the plurality of sub-pixels of the OLED display may include a stack arrangement having N emissive layers in the stack, where N is a least two.

The full-color OLED display may be configured to use not more than a drive current of 0.5 mA/cm$^2$, based on the overall active area of the full-color OLED display, divided by N for the blue sub-pixels of the plurality of sub-pixels disposed in a stack arrangement with N emissive layers, to operate with a luminance of at least 1,000 cd/m$^2$ at the D65 or higher white point.

At least the blue sub-pixel of the device may be a plasmonic PHOLED (phosphorescent organic light emitting device) blue sub-pixel. An anode the plasmonic PHOLED blue sub-pixel may be non-reflective.

According to an embodiment, a consumer electronic device may include a full-color organic light emitting device (OLED) display having a plurality of pixels, with each pixel having a plurality of sub-pixels and where no individual sub-pixel of the plurality of sub-pixels emits white light. The OLED display may be configured to operate with a luminance of at least 1,000 cd/m$^2$ at the D65 or higher white point, and using not more than a 0.5 mA/cm$^2$ drive current for a blue sub-pixel of the plurality of sub-pixels based on an overall active area of the full-color OLED display.

The consumer electronic device may be a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and/or a sign.

BRIEF DESCRIPTION OF THE DRAWINGS

FIGS. 4A-4B show example results of an OLED simulation and example design guidelines for a 500 dpi display using 5 μm OLED design rules that operates at 1,000 cd/m$^2$ with a single stack blue PHOLED subpixel operating at 1 mA/cm$^2$, which corresponds to 0.5 mA/cm$^2$ in the two-stack tandem shown in FIG. 3, and which operates with a luminance of at least 1,000 cd/m$^2$ at the D65 or higher white point, according to an embodiment of the disclosed subject matter.

FIG. 9A shows a general multi-layer structure; FIG. 9B shows the special case of a two-layer gap consisting of a thick dielectric layer and a thin nanoparticle adhesion layer.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
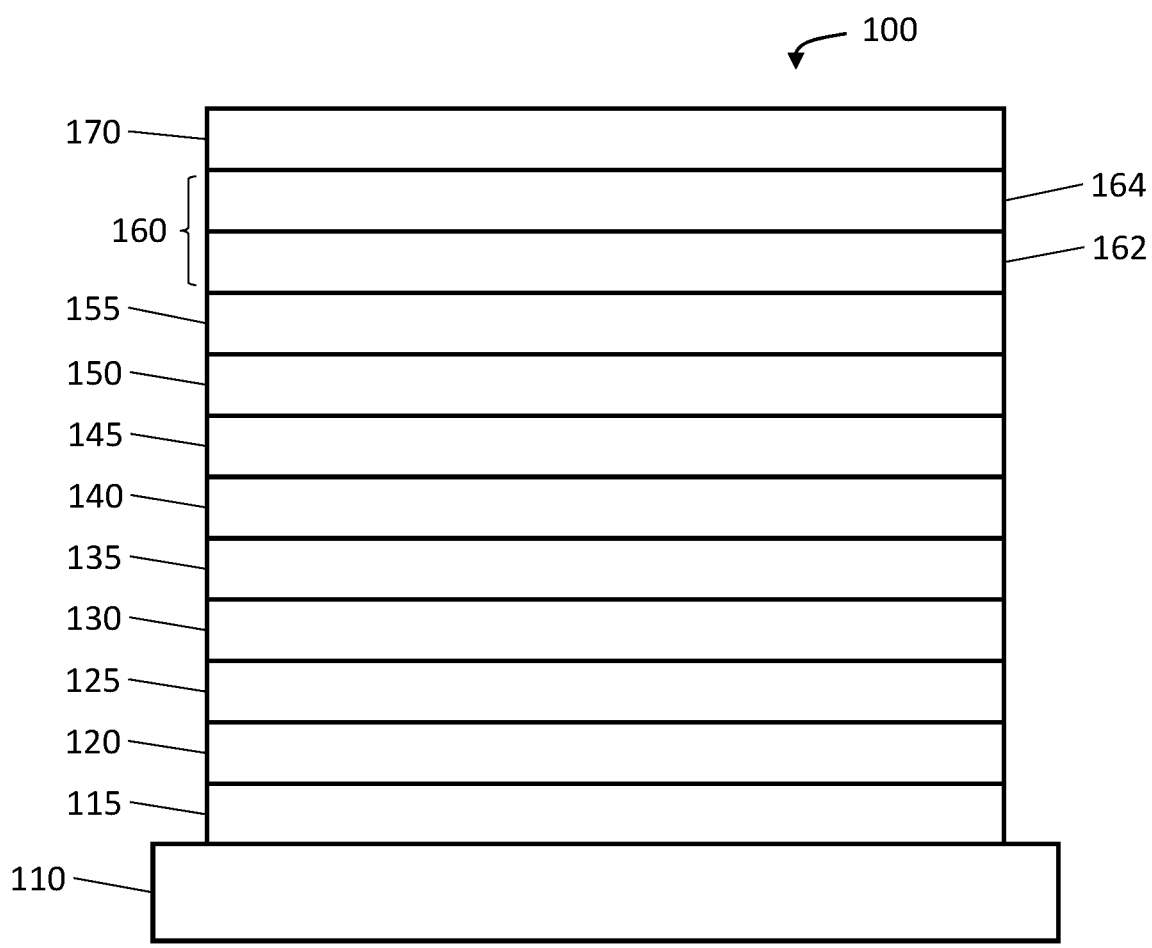
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is Bphen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. Barrier layer 170 may be a single- or multi-layer barrier and may cover or surround the other layers of the device. The barrier layer 170 may also surround the substrate 110, and/or it may be arranged between the substrate and the other layers of the device. The barrier also may be referred to as an encapsulant, encapsulation layer, protective layer, or permeation barrier, and typically provides protection against permeation by moisture, ambient air, and other similar materials through to the other layers of the device. Examples of barrier layer materials and structures are provided in U.S. Pat. Nos. 6,537,688, 6,597,111, 6,664,137, 6,835,950, 6,888,305, 6,888,307, 6,897,474, 7,187,119, and 7,683,534, each of which is incorporated by reference in its entirety.

Figure 2:
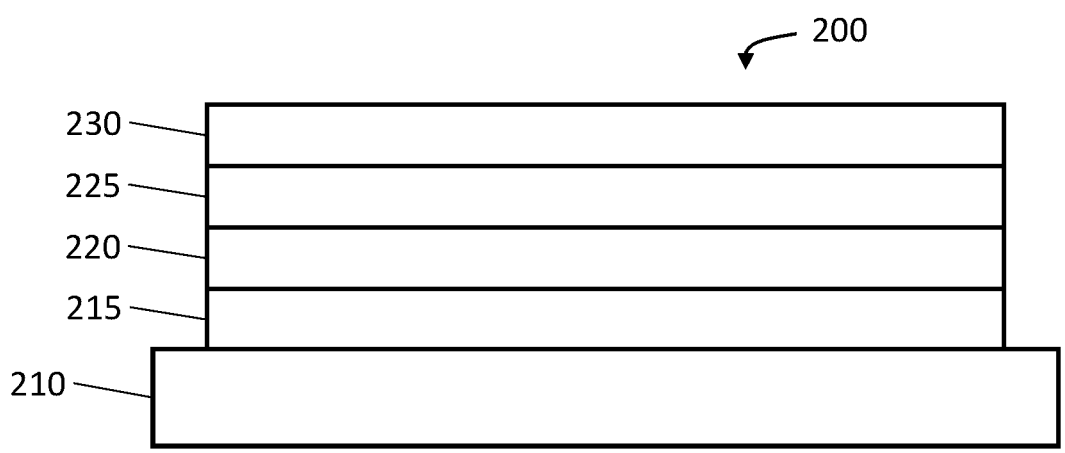
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. In general, an emissive layer includes emissive material within a host matrix. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light based on an injected electrical charge, where the initial light may be altered by another layer such as a color filter or other color altering layer that does not itself emit an initial light within the device, but may re-emit altered light of a different spectra content based upon absorption of the initial light emitted by the emissive layer and downconversion to a lower energy light emission. In some embodiments disclosed herein, the color altering layer, color filter, upconversion, and/or downconversion layer may be disposed outside of an OLED device, such as above or below an electrode of the OLED device.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation.

Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Light emitting devices (LEDs) engineered to couple excited state energy to the surface plasmon (SP) mode of a nearby enhancement layer take advantage of decay rate enhancement to realize improved device stability. Such devices may be referred to as "plasmonic" devices LEDs, OLEDs, or the like. To maintain relatively high device efficiency, plasmonic LEDs, either organic or inorganic, may incorporate a nanoparticle-based outcoupling scheme to convert the plasmon energy into photons extracted outside the device. This outcoupling structure may be referred to as a nanopatch antenna (NPA), which includes a planar metal, atop which is placed a layer of dielectric material which is subsequently coated with nanoparticles. Plasmonic LEDs require that the recombination zone, or emissive layer, be placed within a threshold distance of the enhancement layer. We define the threshold distance as the distance at which a total non-radiative decay rate constant is equal to a total radiative decay rate constant, as explained in further detail in U.S. Pat. Nos. 9,960,386 and 10,403,854, the disclosure of each of which is incorporated herein by reference in its entirety. Examples of nanopatch antenna structures are disclosed in further detail in U.S. Pat. No. 11,139,442 and U.S. Patent Publication Nos. 2021/0265584 and 2021/0249633, the disclosure of each of which is incorporated by reference in its entirety.

Figure 5:
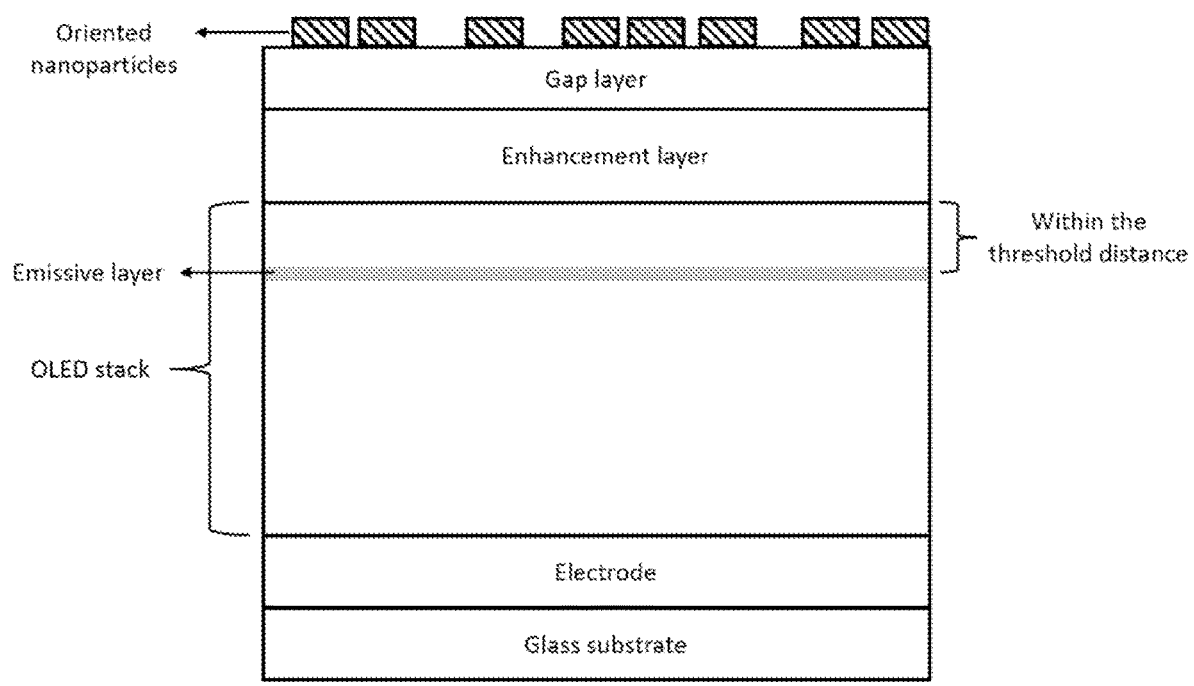
FIG. 5 shows a schematic representation of a plasmonic LED structure incorporating a nanoparticle-based plasmon outcoupling scheme with oriented nanoparticles as disclosed herein.

The structure of a plasmonic OLED is shown schematically in FIG. 5, with the nanoparticle-based outcoupling scheme consisting of the enhancement layer, which is typically, but not limited to, a thin film of metal (often the cathode), a dielectric "gap" layer which spaces the nanoparticles a certain distance away from the enhancement layer, and the nanoparticles themselves disposed over the gap layer. For nanoparticles that are asymmetric in shape, the nanoparticles may be preferentially aligned to achieve certain effects, including, but not limited to, enhancing plasmon outcoupling efficiency, engineering the radiation (emission) pattern of the device, modifying the spectrum of the device, and improving device stability.

Embodiments of the disclosed subject matter provide a novel OLED display that may provide for low power consumption and long operational lifetime, even for high resolution displays at 500 dpi. Reducing the current density to drive blue sub-pixels of the OLED display may provide long operational device lifetimes for consumer and other applications using high efficiency blue OLED emissive layer systems, and in particular phosphorescent blue systems.

Embodiments of the disclosed subject matter may include considerations for the OLED front plane design and a TFT (thin film transistor) backplane to drive the OLED frontplane. Embodiments of the disclosed subject matter may provide a high-performance OLED display which can achieve at least 1,000 cd/m$^2$ full D65 white point operation while using less than or equal to 0.5 mA/cm$^2$ drive current for the blue sub-pixels. This arrangement may provide a long operational display lifetimes at high efficiencies.

Present high-resolution OLED displays often require relatively high pixel drive currents to achieve daylight readability. Low-cost production relies on economies of scale from manufacturing OLED displays on large area substrates, and therefore result in increased alignment and processing tolerances. Both trends may decrease the aperture ratio of OLED display sub-pixels, resulting in higher drive currents and lower operational lifetimes.

Figure 3:
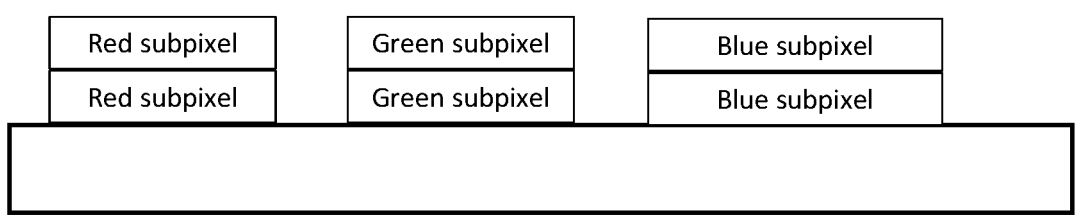
FIG. 3 shows an example subpixel layout for an OLED display based on tandem red, blue and green subpixels according to an embodiment of the disclosed subject matter.

Recent trends in OLED display manufacturing may be used to significantly lower the drive current to blue sub-pixels, thus taking advantage of the high efficiency offered by phosphorescent blue emissive layer systems. In such systems, color filters may be placed over a sub-pixel, which may eliminate the need for a polarizer. This may improve the display efficiency and lower the power consumption of the display. This arrangement may also reduce the OLED drive currents to achieve a luminance level. In general, lower OLED drive currents may increase the operational lifetime of the display. In phosphorescent blue emissive layer systems, tandem structures (e.g., stacked sub-pixels, such as shown in FIG. 3) may be used in OLED displays, and RGB (red, green, blue) side-by-side patterning over large area substrates. Such systems may be used for IT (information technology) and/or mobile product applications. Embodiments of the disclosed subject matter provide design guidelines (such as shown in FIGS. 4A-4B) where an OLED display with a 500 dpi resolution operating at 1,000 cd/m$^2$ may have a blue sub-pixel drive current of less than 0.5 mA/cm$^2$, which may provide long operational lifetimes. Embodiments may also provide backplane design guidelines on how to provide grey scale display operation based on these very low drive currents.

As disclosed herein, the design guidelines (such as shown in FIGS. 4A-4B) may include current less than 1 mA/cm$^2$ to increase lifetime of a blue single layer PHOLED (phosphorescent organic light emitting device) or a current less than 0.5 mA/cm$^2$ to increase lifetime of a blue two-layer tandem PHOLED. The display brightness may be greater than 1,000 nits, so that the display may be daylight readable. The efficiency of the device may be less than 9 mW/cm$^2$, so that the pixels may be on at 1,000 cd/m$^2$. The design guidelines take advantage of recent technology progress with OLED displays such as phosphorescent blue devices, the ability to remove the circular polarizer and replace it with color filters, the adoption of tandem device structures (such as shown in FIG. 3), and the like.

The device may achieve a color gamut that is greater than or equal to DCIP3.

Embodiments of the disclosed subject matter may use SBS (side-by-side) design, top emission, and/or may be capable for a large area device. Devices of the disclosed subject matter may have a greater than 60% sub-pixel fill-factor.

In one embodiment, a blue emissive area per pixel may be greater than or equal to green sub-pixel area or a red sub-pixel area, and may be greater than or equal to the sum of the green sub-pixel and red sub-pixel emissive area.

Embodiments of the disclosed subject matter may be used for IT applications and large area design rules for Generation 8 (and larger) substrates. Embodiments of the disclosed subject matter may use 5 μm design guidelines, where 500 dpi may equal 50 μm pixels.

Equal area sub-pixels may be 50 μm×17 μm. If there is a 5 am patterning alignment, then the active area of each sub-pixel may be 45 μm×12 μm, which may be 63%. In some embodiments, a 50% blue area, a 25% red area, and 25% green area may provide a 72% blue fill-factor, with 54% red and 54% green.

In some embodiments of the disclosed subject matter, a circular polarizer may be disposed over only red and green sub-pixels. This arrangement may have both low display reflectivity and long blue operational lifetime, as the blue OLED drive current would not need to be increased to allow for low optical transmission through a circular polarizer. For example, IJP (ink-jet printed) polymer-based polarizers may be used. Red and/or green sub-pixel may be printed at the same time as the polarizer so there may be only one IJP pass per pixel. Lithography may be used to pattern a circular polarizer. In some embodiments, a polarizer is not used.

With regards to sub-pixel voltage considerations, the blue sub-pixel with no polarizer may have a similar voltage to red and green sub-pixels that may have a polarizer.

With regards to backplane considerations for very low drive currents, if drive currents are reduced to less than 1 mA/cm$^2$, it is possible that there may be an issue with grey level control. For a 0.5 mA/cm$^2$ drive current and a 500 dpi display, sub-pixel currents at full brightness may be as low as 10 nA. For example, to achieve 100 grey levels would require a drive current control and accuracy of 100 pA. This may be difficult to achieve with thin film transistor backplane technology that may allow for higher drive currents to be used. PWM (pulse width modulation) may be employed in one embodiment. A combination of analog controls and PWM may be used. For example, a display panel may be operated at 240 Hz to have four (4) levels of digital grey scale for 60 Hz overall operation. The sub-pixel drive circuit may be turned off through a data voltage for a portion of a frame time in, for example, multiples of a 25% increment.

In another embodiment to address grey level control, the OLED power supply may be pulsed globally to the display so the display is only energized for 50%, 25%, or the like for a frame time. The pulsing may be controlled so that pixel currents and/or luminance may be higher (e.g., two times higher, four times higher, or the like) for the "on" time of the pulsing. This may provide a higher OLED voltage, but may improve the grey scale control by increasing the minimum drive currents and drive current accuracy. PHOLEDs typically have lower efficiency at higher drive currents due to 'roll-off' in efficiency vs. current. This may be overcome by having two power supply rails for the OLEDs. One power supply rail may be a steady-state rail for red and green sub-pixels, and a second power supply rail that is pulsed for the blue sub-pixel. The steady state and the pulsed power supply rails may be generalized for colors needing a pulsed versus steady-state power supply determined by the need to increase OLED current at low grey levels.

In yet another embodiment to address grey level control, small drive TFTs may be used so that the W/L (width/length ratio) is less than 1. Fringing fields may limit this approach.

In another embodiment to address the grey level control, drive TFTs may be used with mobilities u such that $1<u<10$ cm$^2$/Vs. The mobilities selected may not be too low, as it may result in too high a voltage. The selected mobilities may not be too high, as grey scale control may be difficult.

In still another embodiment, drive TFT gate capacitance may be reduced. Typically, high gate capacitance may reduce gate voltage. A thicker dielectric or lower dielectric constant may be used to increase gate voltage to allow for easier control of grey scale. For example, the gate capacitance may be less than 1E-8 F/cm$^2$. Typically, higher gate capacitance is preferred to reduce gate voltage.

Embodiments of the disclosed subject matter may provide a device with a full-color organic light emitting device (OLED) display having a plurality of pixels. Each pixel may have a plurality of sub-pixels, and no individual sub-pixel of the plurality of sub-pixels may emit white light. Typically, a white sub-pixel that emits white light may have a combination of emitters that are equivalent to an RGB (red, green, blue) arrangement, or may use a BY (blue and yellow) sub-pixel arrangement. That is, embodiments of the disclosed subject matter have a full-color OLED display, but do not have white sub-pixels. The OLED display may be configured to operate with a luminance of at least 1,000 cd/m$^2$ at the D65 or higher white point, and using not more than a 0.5 mA/cm$^2$ drive current for a blue sub-pixel of the plurality of sub-pixels based on an overall active area of the full-color OLED display based on including the area of the regions in each pixel that do not emit light. The overall active area of the OLED display may be an area from which light may be controlled to be emitted from. In some embodiments, the OLED display may be configured to operate with the luminance of at least 1,000 cd/m$^2$ at the D65 or higher white point at a DCI-P3 color gamut, or with greater than 64% of the Rec2020 color gamut. A resolution of the OLED display may be greater than 400 dpi (dots per inch), and/or greater than 500 dpi.

The drive current provided to at least one of the plurality of sub-pixels of the full-color OLED display may be pulsed with a duty cycle that is less than 100%. In some embodiments, the plurality of sub-pixels may include at least one blue sub-pixel. The drive current to the at least one blue sub-pixel may be pulsed with a duty cycle that is less than 100%.

The sub-pixels of the OLED display may include a first blue emissive layer disposed on a second blue emissive layer to form a blue tandem sub-pixel, such as shown in FIG. 3. The drive current of the blue tandem sub-pixel may be less than 0.25 mA/cm$^2$, based on the overall active area of the full-color OLED display. FIG. 3 shows that a first red emissive layer may be disposed on a second red emissive layer to form a red tandem sub-pixel, and that a first green emissive layer may be disposed on a second green emissive layer to form a green tandem sub-pixel.

The plurality of sub-pixels of the device may include blue sub-pixels, green sub-pixels, and red subpixels. As shown in FIG. 3, a first sub-pixel area that includes the blue sub-pixels may be larger than a second sub-pixel area that includes the green sub-pixels, and/or a third sub-pixel area that includes the red sub-pixels. In some embodiments, a first sub-pixel area that includes the blue sub-pixels may be larger than a combination of a second sub-pixel area that includes the green sub-pixels and a third sub-pixel area that includes the red sub-pixels.

In some embodiments, each pixel of the plurality of pixels of the full-color OLED display may have no more than three sub-pixels. For example, the sub-pixels in this arrangement may include red, green, and blue sub-pixels. In some embodiments, each pixel of the plurality of pixels of the device may have more than three sub-pixels. In this arrangement, the sub-pixels may include red, green, and blue sub-pixels, and may include a light blue sub-pixel, a yellow sub-pixel, two blue sub-pixels, or the like. In some embodiments, the device may include a circular polarizer disposed over only the red sub-pixels and the green sub-pixels. In this arrangement, no polarizer would be disposed over the blue sub-pixels. In some embodiments, a color filter may be disposed over the blue sub-pixels.

A power consumption of the OLED display may be less than 9 mW/cm$^2$ at equal or greater to D65 white point at 1,000 nits, excluding a driving circuitry power consumption that is external to the active area of the full-color OLED display. In some embodiments, the device may include a power supply to provide a pulsed power the OLED display at less than a 100% duty cycle when the OLED display is on. The pulsed power may be used to increase a sub-pixel luminance of the full-color OLED display.

The device may include a first global power supply rail configured to provide steady-state power to the OLED display. A second global power supply rail may be configured to provide pulsed power to the OLED display at less than a 100% duty cycle. The duty cycle may be selected to increase sub-pixel current for grey scale control. In some embodiments, the first global power supply rail may provide steady state power to at least one of the plurality of sub-pixels, and the second global power supply provides pulsed power to at least another one of the plurality of sub-pixels.

In some embodiments, the OLED display of the device may include a drive TFT (thin film transistor) gate capacitance that is less than 1×10$^{-8}$ F/cm$^2$. A mobility of the drive TFT may be between 1-10 cm$^2$/V*s.

A blue sub-pixel of the plurality of sub-pixels of the device may be shared between at least two pixels of the plurality of pixels. In some embodiments, such as shown in FIG. 3, at least one pixel of the plurality of pixels of the OLED display of the device may include a first blue sub-pixel disposed on a second blue sub-pixel to form a blue tandem sub-pixel, a first green sub-pixel disposed on a second green sub-pixel to form a green tandem sub-pixel, and a first red sub-pixel disposed on a second red sub-pixel to form a red tandem sub-pixel. That is, at least one sub-pixel of the plurality of sub-pixels of the OLED display may include a stack arrangement having N emissive layers in the stack, where N is a least two. The full-color OLED display may be configured to use not more than a drive current of 0.5 mA/cm$^2$, based on the overall active area of the full-color OLED display at equal to or greater than a D65 white point at 1,000 nits, divided by N for the blue sub-pixels of the plurality of sub-pixels disposed in a stack arrangement with N emissive layers.

At least the blue sub-pixel of the device may be a plasmonic PHOLED (phosphorescent organic light emitting device) blue sub-pixel. An anode of the plasmonic PHOLED blue sub-pixel may be non-reflective. The anode may be non-reflective when its reflectivity is less than 40%, less than 20%, less than 10%, less than 5%, less than 2%, less than 1%, or the like.

Embodiments disclosed herein may be used in conjunction with an enhancement layer, as previously disclosed, and the nanoparticle arrangement may be described in relation to such an enhancement layer. The placement of the light-emitting material in the vicinity of an enhancement layer, which can include metallic materials or other plasmonically-active materials, increases interactions with the surface plasmon polariton at the enhancement layer dielectric interface. The device is designed such that the non-radiative modes of the enhancement layer quench the light emitter. Light is subsequently created in free space by scattering the energy from the plasmonic modes of the enhancement layer through the use of an outcoupling layer. The enhancement layer will non-radiatively couple to fluorescent, delayed-fluorescent, and phosphorescent light emitting materials but is especially useful for phosphorescent light emitters due to their small radiative decay rate constant. Rapid de-excitation of the light emitting material via resonant energy transfer to the enhancement layer surface plasmon polariton is expected to increase the stability of the OLED.

An example embodiment may be considered in which the enhancement layer is a thin film of silver (Ag). This thin film of silver has a surface plasmon mode. The emissive material also may be in proximity to the silver film. For simplicity, the emissive material may be considered as a single emitting material but in various embodiments the emissive material can be, but is not limited to, layers of materials which are doped at high volume fractions of emissive material, neat layers of emissive material, an emissive material doped into a host, an emissive layer that has multiple emitting materials, an emissive layer in which the emission originates from a state formed between two materials, such as an exciplex or an excimer.

In an OLED, an important aspect of the emissive material is the photon yield which is also known as the photo luminescent quantum yield (PLQY). We can describe the photon yield as:

$$\text{Photon yield} = \frac{k_{rad}^{total}}{k_{rad}^{total} + k_{non-rad}^{total}} \quad (1)$$

where $k_{rad}^{total}$ is the sum of all the radiative processes and $k_{non-rad}^{total}$ is the sum of all the non-radiative processes. For an isolated emitter in vacuum, we can define the molecular radiative and non-radiative rates, $k^0_{rad}$ and $k^0_{non-rad}$ as the only radiative and non-radiative processes. For the isolated molecule the yield of photons is then $$\text{Photon yield}^0 = \frac{k_{rad}^0}{k_{rad}^0 + k_{non-rad}^0} \quad (2)$$

Upon bringing an emissive material in proximity to the silver film, both the radiative and non-radiative rates may be modified as they are strongly dependent on the distance of the emitter from the interface between the metal and the dielectric medium in which the emitter sits. We can then re-cast equation (1) into equation (3) by adding the terms of $k_{rad}^{plasmon}$ and $k_{non-rad}^{plasmon}$ where $k_{rad}^{plasmon}$ is the radiative rate due to the presence of the Ag film and $k_{non-rad}^{plasmon}$ is the non-radiative rate due to the presence of the Ag film.

$$\text{Photon yield} = \frac{k_{rad}^{total}}{k_{rad}^{total} + k_{non-rad}^{total}} = \frac{k_{rad}^0 + k_{rad}^{plasmon}}{k_{rad}^0 + k_{rad}^{plasmon} + k_{non-rad}^0 + k_{non-rad}^{plasmon}} \quad (3)$$

Figure 6A:
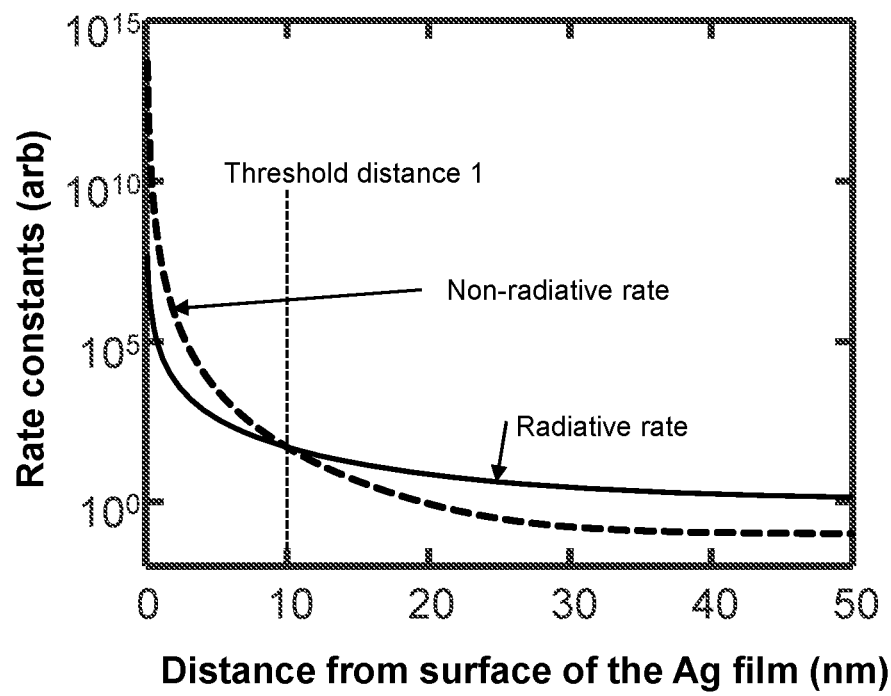
FIG. 6A shows a depiction of the rate constants versus distance from the surface of the silver film for an embodiment of an emissive material in an OLED with an enhancement layer of a silver film as disclosed herein. The distance is the distance from the metallic film surface closest to the emissive layer to the emissive material. A dashed line marks the distance at which the radiative rate is equal to the non-radiative rate and is threshold distance 1 as defined herein.

This is shown in FIG. 6A, which shows the total radiative and non-radiative rates for an emitter as a function of distance from the surface of the Ag film. The distance is the distance from the metallic film surface closest to the emissive layer to the emissive material. A dashed line marks the distance at which the radiative rate is equal to the non-radiative rate and is a threshold distance. At this threshold distance the photon yield is 50%. Further, this basic breakdown of rates shows why in typical OLED devices the emissive layer is positioned a large distance away from any plasmonically-active material. If the emissive layer is too close to the metal layer, the energy is coupled non-radiatively into the plasmon modes of the contact(s) and there is a reduction in the efficiency of the device. In our invention, we extract the energy that would otherwise be lost in the non-radiative mode of the thin Ag film as photons outside the device utilizing an outcoupling layer. Thus, we recover the energy coupled to the surface plasmon mode of the enhancement layer in our invention and it is beneficial, instead of deleterious, to enhance the amount of non-radiative coupling to the surface plasmon mode of the Ag film.

Figure 6B:
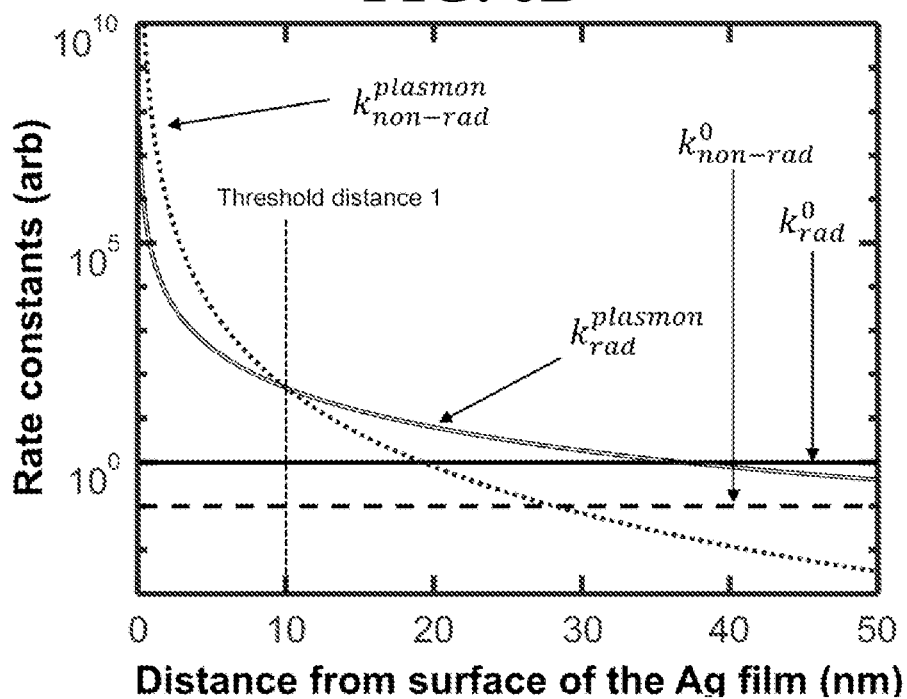
FIG. 6B shows rate constants versus distance from the surface of the silver film for an embodiment of an emissive material in an OLED with an enhancement layer of a silver film where the rate constants are broken out into example components as demonstrated in equation 3 as disclosed herein. The distance is the distance from the metallic film surface closest to the emissive layer to the emissive material.

To understand how to maximize the efficiency of the enhancement layer devices in this invention, we utilize some assumptions about the relative dependence on distance for the plasmon radiative and non-radiative rates and break down the rate constants from FIG. 6A into the component rates as shown in FIG. 6B and described in Equation 3.

In FIG. 6B, the emitter's intrinsic radiative rate is plotted (solid line), as well as the radiative rate constant due to the emitter's proximity to the Ag thin film, which is $k_{rad}^{plasmon}$ in Equation 3 (double line). The emitter's intrinsic radiative decay rate is not dependent on the distance from the Ag film, d. However, $k_{rad}^{plasmon}$ is dependent on the distance from the Ag film, where here it is assumed to have a $1/d^3$ dependence. This is an illustrative example only and the actual dependence on distance can be a more complicated function, for example, when d is less than 7 nm or when d is on the order of the wavelength of emission divided by two times the index of refraction. Like the radiative rate, the non-radiative rate in vacuum of the emitter is not a function of distance from the Ag film. However, the non-radiative rate due to the presence of the Ag film, $k_{non-rad}^{plasmon}$, is dependent on the distance from the Ag film and has a stronger dependence on distance than $k_{rad}^{plasmon}$ namely, $1/d^6$.

Figure 6C:
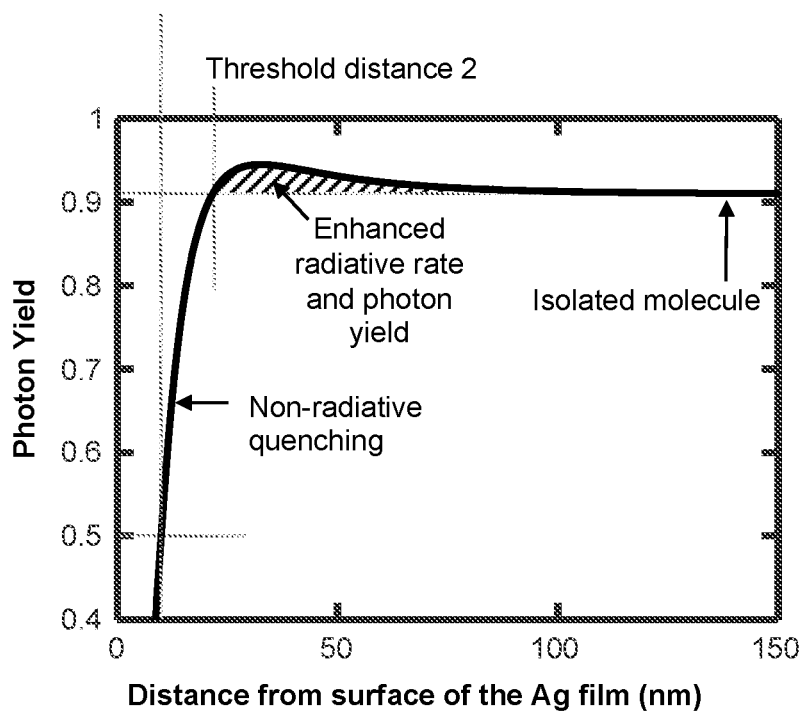
FIG. 6C shows photon yield versus distance from the surface of the silver film for an embodiment of an emissive material in an OLED with an enhancement layer of a silver film plotted for the rate constants in FIGS. 5A and 5B as disclosed herein. In this embodiment no outcoupling structure is part of or near the enhancement layer so all non-radiative coupling is dissipated as heat.

The different dependencies on distance from the metallic film results in a range of distances over which the radiative rate constant due to interaction with the surface plasmon is the largest rate constant. For these distances the photon yield is increased over the photon yield of an isolated molecule far from the metallic surface, as shown in FIG. 6C. At these distances there is also a speed-up in the emission rate for the light emitting material. As d is reduced from this point, the emitter is quenched into the non-radiative modes to the surface plasmon mode of the Ag film, and the yield of photons decreases below the limit of the isolated molecule. The point at which yield is reduced due to quenching to the surface plasmon mode is threshold distance 2. This is the minimum distance at which the photon yield is the same as the emitter without the enhancement layer. At distances below this threshold distance, there is an even larger speed up in the rate at which energy leaves the light emitter as the non-radiative rate exceeds the radiative rate for these distances. Importantly, in FIG. 6C, it is clear that excitons are the source of energy transferred to the enhancement layer as the photon yield is lowered by moving the emission layer closer to the Ag thin film. Obtaining a curve similar in shape to FIG. 6C clearly indicates that excitons in the OLED are the species being quenching by the addition of the enhancement layer. Further, FIG. 6C is only one embodiment of the shape of the curve. In some cases where the distance dependence of $k_{non-rad}^{plasmon}$ is more similar to $k_{rad}^{plasmon}$ there may only be a continuous drop in the photon yield as d is reduced.

Using the rate constants from above, we can specifically define the threshold distance 2 as the distance at which the following inequality is satisfied:

$$\frac{k_{rad}^0 + k_{rad}^{plasmon}}{k_{rad}^0 + k_{rad}^{plasmon} + k_{non-rad}^0 + k_{non-rad}^{plasmon}} \le \frac{k_{rad}^0}{k_{rad}^0 + k_{non-rad}^0} \quad (4a)$$

$$k_{non-rad}^{plasmon} \ge \frac{k_{non-rad}^0}{k_{rad}^0} k_{rad}^{plasmon} \quad (4)$$

Plainly, Equation 4a is the condition in which the PLQY when the enhancement layer is present is less than or equal to the photon yield without the enhancement layer. One knowledgeable in the art would not recommend operating when the photon yield is reduced as that typically reduces device efficiency. Equation 4 solves equation 4a for $k_{non-rad}^{plasmon}$ relative to the other rate constants. We can re-cast equation 4 explicitly utilizing the distance dependence of the plasmon rates as Equation 5:

$$k_{non-rad}^{plasmon}(d) \ge \frac{k_{non-rad}^0}{k_{rad}^0} k_{rad}^{plasmon}(d) \quad (5)$$

where d is the distance of the emitter from the surface of metallic film closest to the emitter.

Further, we can define a threshold distance 1 as the distance at which the emitter's photon yield is reduced to 50%. This threshold distance is the distance at which the total of the non-radiative rates from the emitter is equal to the total of the radiative rates of the emitter. Or plainly, the radiative rate of the emitter is equal to the non-radiative rate. Using the distance-dependent plasmonic rates and equation 3, we derive that the threshold distance 1 is when:

$$k_{non-rad}^{plasmon}(d)+k_{non-rad}^{0}=k_{rad}^{0}+k_{rad}^{plasmon}(d) \tag{6}$$

To determine threshold distance 1, if the enhancement layer does not radiate light, then one can simply grow an OLED, or comparable thin film representative examples, with the light-emitting material variable distances from the enhancement layer and determine at which distance the PLQY drops to 50%. If the enhancement layer has elements which enable outcoupling of light from the surface plasmon mode, these elements need to be removed to determine the threshold distance. It is important not to measure the relative increase or decrease in light output but the actual PLQY as the emission radiation pattern and absorption of the emitter can vary as the position of the emitter relative to the thin film of Ag is changed.

To determine threshold distance 2 as described by Equation 4, one should measure the temperature of the OLED. Since non-radiative quenching of the exciton generates heat instead of photons, the OLED will heat up. Very simply, the heat generated in the OLED will be proportional to the yield of non-radiatively recombined excitons:

$$\text{Heat yield} \propto \frac{k_{non-rad}^{total}}{k_{rad}^{total}+k_{non-rad}^{total}} \tag{5}$$

As the distance between the light emitter and the metallic film is varied, the total heat conduction of the OLED will remain essentially constant, however, the heat yield will vary greatly.

Figure 6D:
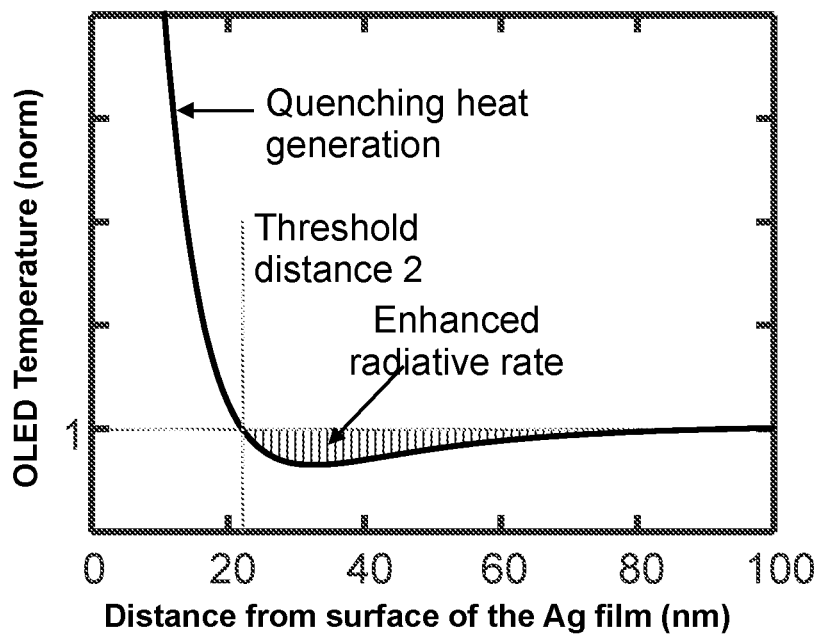
FIG. 6D shows the temperature of the OLED as a function of distance from the surface of the silver film for an embodiment of an emissive material in an OLED with an enhancement layer of a silver film plotted for the rate constants in FIGS. 5A and 5B as disclosed herein. In this embodiment no outcoupling structure is part of or near the enhancement layer so all non-radiative coupling is dissipated as heat which then increases the temperature of the OLED.

FIG. 6D shows the steady state temperature of the OLED as the distance between the light emitter and metallic film is varied for a fixed current density of operation. For large distances of the emitting layer from the metallic surface there is no enhancement of the radiation or non-radiative quenching. The temperature of the OLED depends only on the total current density of operation and the efficiency of the light emitting material. As the emitter is brought closer to the metallic layer, the radiative rate increases and the photon yield is increases, reducing the heat generated in the OLED and the OLED's temperature. For distances shorter than threshold distance 2, the excitons on the light emitter are quenched as heat and the OLED's normalized temperature increases. This depiction of the temperature of the OLED is true when the enhancement layer is not outcoupling a predetermined significant fraction of energy in the surface plasmon mode as light. If there is outcoupling as part of the enhancement layer or an outcoupling layer is used in the device, such a layer is to be removed to perform this measurement of the threshold distance.

There are two possible tests to determine if the light emitter is positioned where the radiative or non-radiative surface plasmon rate constant is dominant using temperature. The first is to measure the temperature of the OLED devices with variable distance of the light emitting material from the metallic film, thereby replicating the schematic curve in FIG. 6D. The second is to replace the metallic film in the device structure with a transparent conducting oxide that does not have a strong surface plasmon resonance. An example material is indium tin oxide (ITO). Measuring the temperature of the device with the ITO and with the metallic film, if the temperature of the OLED with the metallic film is increased over the ITO control, then the non-radiative rate is dominant and the emitter is within threshold distance 2 of the enhancement layer.

Non-radiative energy transfer to the plasmon mode here is defined as the process in which the exciton is transferred from the light-emitting material to the surface plasmon polariton (SPP), localized surface plasmon polariton (LSPP), or other terminology those versed in the art would understand as a plasmon, without emitting a photon. Depending on the dimensionality of the metallic film or the metallic nanoparticles this process can be called Forster energy transfer, Forster resonant energy transfer, surface resonant energy transfer, resonant energy transfer, non-radiative energy transfer, or other terminology common to those versed in the art. These terms describe the same fundamental process. For weakly emissive states, energy transfer to the SPP or LSPP may also occur through Dexter energy transfer, which involves the simultaneous exchange of two electrons. It may also occur as a two-step process of single electron transfer events. Non-radiative energy transfer is broadband, meaning that in some embodiments the enhancement layer is not tuned for a particular light emitting material.

Embodiments disclose herein do not utilize the radiative rate enhancement of the surface plasmon polariton but rather the non-radiative rate enhancement. Those knowledgeable in the art of OLEDs and plasmonics teach against energy transfer to the non-radiative mode of the surface plasmon polariton as that energy is typically lost as heat. Here we intentionally put as much energy as possible into the non-radiative and then extract that energy to free space as light using an outcoupling layer before that energy is lost as heat. This is a novel idea because it is a unique two-step process and goes against what those knowledgeable in the art would teach about the non-radiative modes of a surface plasmon polariton.

Figure 6E:
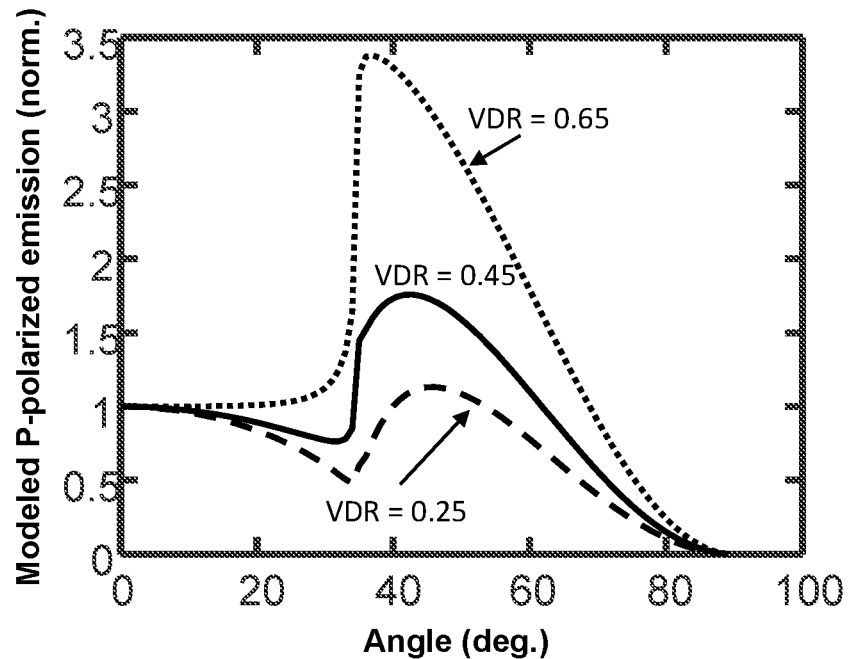
FIG. 6E shows modeled P-polarized photoluminescence as a function of angle for different VDR emitters as disclosed herein. In this example, there is a 30 nm thick film of material with index of 1.75 and the emission is monitored in a semi-infinite medium of index of 1.75. Each curve is normalized to a photoluminescence intensity of 1 at an angle of zero degrees, which is perpendicular to the surface of the film. As the VDR of the emitter is varied, the peak around 45 degrees increases greatly. When using software to fit the VDR of experimental data, the modeled VDR would be varied until the difference between the modeled data and the experimental data was minimized.

Vertical dipole ratio (VDR) is the ensemble averaged fraction of dipoles that are oriented vertically. A similar concept is horizontal dipole ratio (HDR) is the ensemble average fraction of dipoles oriented horizontally. By definition, VDR+HDR=1. VDR can be measured by angle dependent, polarization dependent, photoluminescence measurements. By comparing the measured emission pattern of a photoexcited thin film sample, as a function of polarization, to the computationally modeled pattern, one can determine VDR of the emission layer. For example, in FIG. 6E, the modelled p-polarized angle PL is plotted for emitters with different VDRs. There is a peak in the data around 45 degrees with that peak in the data being larger when the VDR of the emitter is higher, as shown in the modeled data of p-polarized emission in FIG. 6E.

Importantly, the VDR represents the average dipole orientation of the light-emitting species. Thus, if there are additional emitters in the emissive layer that are not contributing to the emission, the VDR measurement does not report or reflect their VDR. Further, by inclusion of a host that interacts with the emitter, the VDR of a given emitter can be modified, resulting in the measured VDR for the layer that is different from that of the emitter in a different host. Further, in some embodiments, exciplex or excimers are desirable which form emissive states between two neighboring molecules. These emissive states may have a VDR that is different than that if only one of the components of the exciplex or excimer were emitting.

Figure 9A:
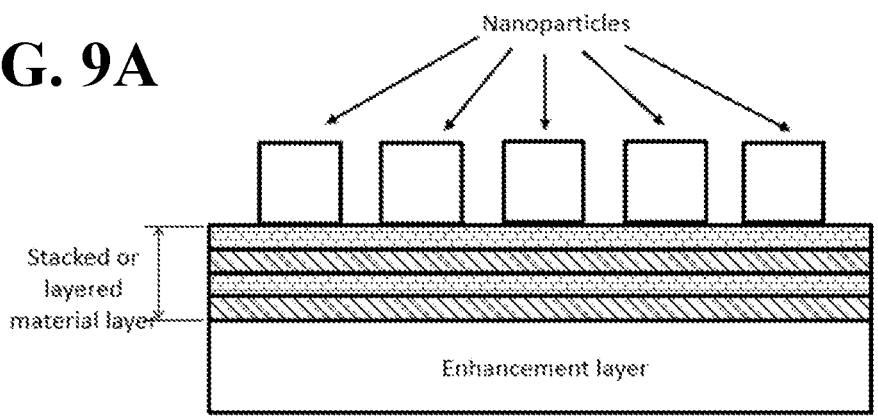
FIGS. 9A-9B schematically depict a dielectric gap consisting of multiple stacks or layers as disclosed herein.
Figure 9B:
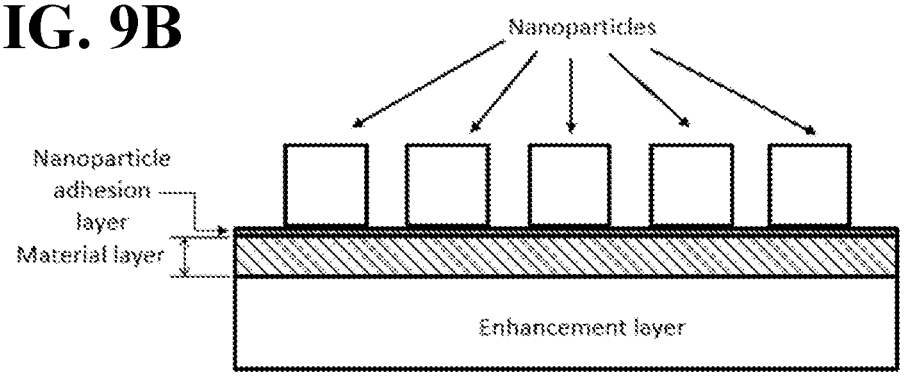

The gap material may consist of, but is not limited to, organics (small molecule and/or polymer), oxides, or other dielectric materials, including stacks, alloys, or mixtures of materials, as shown in FIG. 9A. The stacked gap layer may include two layers as shown in FIG. 9B, one thicker, which acts as the primary dielectric gap material, and another thin layer that acts as a nanoparticle adhesion layer and may increase nanoparticle density and/or reduce nanoparticle aggregation or clumping, particularly for colloidally processed nanoparticles. For example, polyelectrolyte layers (such as poly(styrenesulfonate) or poly(allylamine) hydrochloride) are known to carry an electrostatic charge that can interact with the electrostatic charge on a nanoparticle coating (for example, poly(vinylpyrrolidinone), which is commonly used to coat silver nanoparticles, carries a negative electrostatic charge). While the summation of the thicknesses of these layers determines the overall gap thickness, typical adhesion layer thicknesses are less than 5 nm, and gap layer thicknesses are between 1 to 100 nm, more preferable between 1 to 50 nm.

In some embodiments the enhancement layer is a planar metal film and/or metal nanoparticles and may be pure or an alloy or a mixture, preferably of Ag, Al, Ag—Al alloys, or Au, as shown in FIG. 6D. The enhancement layer may be composed of other materials including, but are not limited to Ir, Pt, Ni, Cu, W, Ta, Fe, Cr, Mg, Ga, Rh, Ti, Ca, Ru, Pd, In, Bi. The nanoparticles, additionally, may consist entirely of dielectric materials, may be an alloy of metals, may be dielectric materials, or may have a core of one type of material and be coated with a shell of a different type of material. Typical nanoparticle sizes for scattering out light in the visible part of the spectrum range from 5 nm to 1000 nm, depending on the nanoparticle material and shape. If the OLED or LED is designed for emission in the near infrared or infrared the particle size may range from 500 nm to 5000 nm. See Table 1 for example potential enhancement layer and/or metal nanoparticle materials and particle size ranges. Gap thicknesses range from 0-150 nm, more preferably from 0-50 nm for visible emission and larger for the infrared spectrum. Note that in the special case where the gap is 0 nm (i.e., no gap), the nanoparticles sit directly atop the planar metal and may serve as a form of corrugation to outcouple the surface plasmon energy. The gap will typically consist of a dielectric material, such as an organic material, metal oxide (crystalline or amorphous), or a nitride, with refractive index from 1-5. The refractive index of the gap can range from 1.01 to 5, depending on the material utilized. The nanopatch antenna resonance may be tunable by at least one of varying a size of the plurality of nanoparticles, varying a shape of the plurality of nanoparticles, changing a material of the plurality of nanoparticles, adjusting a thickness of the material, changing the refractive index of the material layer, changing the refractive index of the material or an additional layer disposed on the plurality of nanoparticles, varying a thickness of the electrode layer, and/or varying the material of the first electrode layer. The plurality of nanoparticles may be formed from at least one of Ag particles, Al particles, Au particles, dielectric material, semiconductor materials, an alloy of metal, a mixture of dielectric materials, a stack of one or more materials, and/or a core of one type of material and that is coated with a shell of a different type of material. At least one of the plurality of nanoparticles of the device may include an additional layer to provide lateral conduction among the plurality of nanoparticles. The plurality of nanoparticles may be coated with an oxide layer, where a thickness of the oxide layer may be selected to tune a plasmonic resonance wavelength of the plurality of nanoparticles or a nanopatch antenna. A shape of the plurality of nanoparticles may be at least one of cubes, spheres, spheroids, cylindrical, parallelepiped, rod-shaped, star-shaped, pyramidal, and/or multi-faceted three-dimensional objects. A size of at least one of the plurality of nanoparticles may be from 5 nm to 1000 nm.

In some embodiments the device may include an additional layer disposed on the plurality of nanoparticles. The additional layer may include one or more emitter molecules. The additional layer may match a refractive index beneath the first electrode layer. The additional layer has a thickness of 1000 nm or less.

In some embodiments the plurality of nanoparticles is deposited via inkjet printing, in other the plurality of nanoparticles is deposited via a mechanism that involves touch like brushing, in other embodiments the plurality of nanoparticles is deposited via spraying the particles suspended in a solvent or aerosol. In other embodiments the plurality of nanoparticles is fabricated through a top-down approach which may include a lift-off process, a development process, a light-based lithography such as photolithography or laser interference lithography or zone plate lithography, an electron beam lithography process, and/or focused ion milling process. In some embodiments the plurality of nanoparticles is deposited via one or more of the following methods: spin coating, doctor blading process, slot-die coating, bar coating or dip coating. Once the nanoparticles are deposited in some embodiments a drying process may be employed to remove any residual solvent, air or moisture from the deposition surface. Such drying methods include vacuum drying, nitrogen blow off, HEPA drying, drying in a convection oven, surface tension gradient drying, IPA vapor vacuum drying, and spin drying.

In some embodiments the LED/enhancement layer/nanoparticles are encapsulated. Such encapsulation materials include oxide coatings and epoxies e.g., polyurethane, silicone etc and may be deposited by atomic layer deposition or chemical vapor deposition. In some embodiments the LED/enhancement layer/nanoparticles also act as an encapsulation layer.

In some embodiments the plurality of nanoparticles is not formed of a single size or shape but multiple different sizes or shapes. This would enable the outcoupling layer to efficiently scatter light of multiple frequencies or colors all with the same layer.

In some embodiments, a white OLED or LED may utilize a nanoparticle outcoupling scheme of a specific resonance to selectively outcouple a certain wavelength range. In this way, a white OLED or LED can be fabricated over a large area and the resonance of the nanoparticle outcoupling scheme (via choosing nanoparticle size, refractive index, etc.) may be utilized to create red, green, blue (or any other desired color) subpixels.

Figure 7:
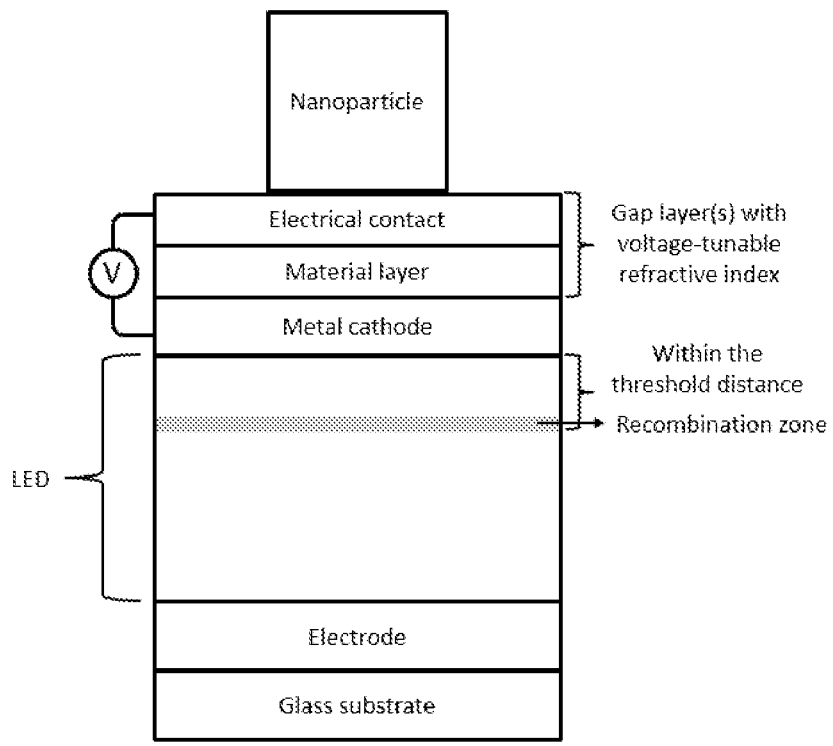
FIG. 7 shows a nanoparticle and enhancement layer arranged to form a nanopatch antenna which uses a dielectric material with voltage-tunable refractive index for selecting the wavelength of emitted light as disclosed herein.

Since the refractive index of the gap layer(s) affects the resonance of the nanopatch antenna, incorporating gap materials that have non-linear optical properties and/or voltage-tunable refractive index serves as a way to tune the emission spectrum with voltage applied between the metal cathode and an electrical contact layer beneath the nanoparticle as shown in FIG. 7. In one example, aluminum-doped zinc oxide may be used as the voltage-tunable refractive index material since its permittivity is varied when an applied voltage modifies the carrier concentration (George, et al). In this case, a second insulating layer is needed in the gap to build the charge, but such a secondary layer may not always be necessary depending on the material properties of the voltage-tunable refractive index layer. This is particularly useful when the OLED or LED is a white emitting, i.e., containing red, green, and blue emission, since the voltage-tunable nanopatch resonance can act as a color filter to selectively pass the desired color. This effectively converts the OLED or LED into a three-terminal device, with the voltage applied between the anode and cathode operating the OLED/LED, and the voltage applied between the cathode and the electrical contact layer beneath the nanoparticle tuning the nanopatch resonance to select the emitted color.

In the case of individual OLED or LED subpixels, say in a display, the resonance of the nanoparticle outcoupling scheme may be purposely mismatched from the native emission of the device. In this way, the nanoparticle outcoupling scheme acts as a color filter to slightly shift the peak wavelength. In another embodiment, a resonance-mismatched nanoparticle outcoupling scheme may be used to narrow the emission spectrum. For example, a green OLED or LED paired with a blue resonant outcoupling scheme will see a narrowing by reducing the LEDs redder wavelengths. Conversely, pairing a green OLED or LED with a red resonance outcoupling scheme will see a narrowing by reducing the device's bluer wavelengths.

Figure 8A:
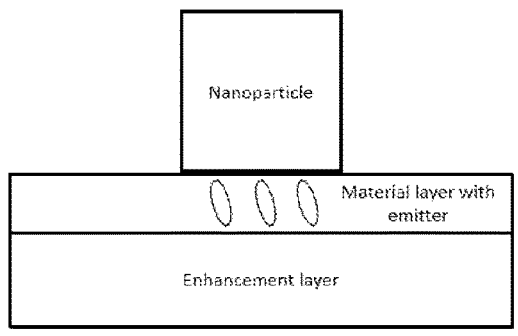
FIGS. 8A-8C show examples of one or more emissive outcoupling layers in close proximity to the enhancement layer as disclosed herein.
Figure 8B:
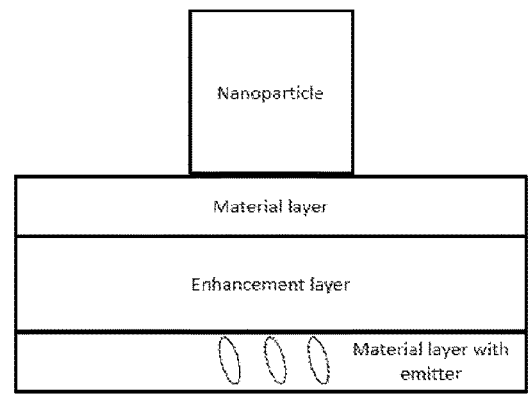
Figure 8C:
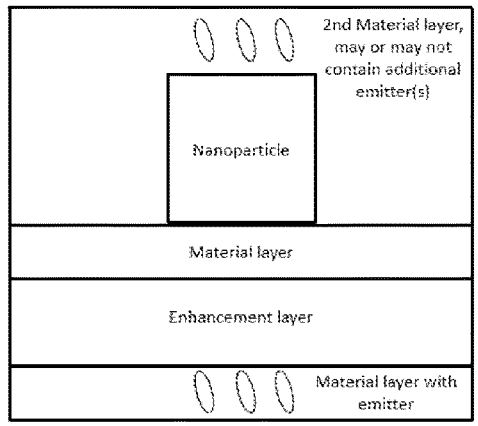

In another embodiment, the device may include an emissive outcoupling layer in close proximity to the enhancement layer as shown in FIGS. 8A-8C. The emissive outcoupling layer(s) contain(s) an emissive material that can be excited by the energy of the surface plasmon polaritons in the nearby enhancement layer. The emissive material may be, but is not limited to, a quantum dot, perovskite nanocrystals, metal-organic frameworks, covalent-organic frameworks, a thermally activated delayed fluorescence (TADF) emitter, a fluorescent emitter, or a phosphorescent organic emitter. In one example device, it may be advantageous for the emissive material to have absorption and emission spectra demonstrating a small Stokes shift, such that only a small red-shift occurs between the LED excited state energy that is quenched into the enhancement layer and the emitted light from the emissive outcoupling layer(s). This preserves the emission color of the device. In another example device, the emissive material can be specifically chosen to down-convert a higher-energy excitation (eg. blue) to a lower-energy wavelength (eg. green or red). This enables a single LED structure to be utilized in every pixel of a display, with the color chosen by the emissive outcoupling layer. For example, this can be accomplished by depositing different-sized quantum dots in the outcoupling layer(s) of different pixels to tune the emission wavelength. The emissive outcoupling layer may or may not be combined with the nanoparticle based outcoupling scheme, in which case the emissive outcoupling layer would sit between the enhancement layer and the nanoparticle. In this case, the outcoupling efficiency may be enhanced even further as the radiative rate of the emissive material in the emissive outcoupling layer should be sped up.

The arrangement of the nanoparticles on the surface of the dielectric gap may also be designed to fit the device application. In one embodiment, a random arrangement of nanoparticles results in a nearly Lambertian emission profile, which may be preferable for use in lighting applications or display applications where point source emission is not desired. For example, inorganic LEDs tend to suffer from directional emission profiles thereby making the random nanoparticle array particularly attractive in certain applications. In another embodiment, the nanoparticles may be arranged into an array, thereby resulting in a dispersive emission profile that may be desired for some mobile applications or in applications that require the most outcoupling of light regardless of the angular dependence. Nanoparticles arranged into an array may achieve greater efficiencies than randomly arranged nanoparticles and selecting a specific array pitch and duty cycle will enable tuning of the array resonance and hence outcoupling wavelength at which the array has the largest efficiency.

In other embodiments, the nanoparticles are metallic and coated with a non-metallic coating and then placed on top of the enhancement layer directly. In this embodiment the refractive index of the coating may be between 1.01 and 5. The thickness of the coating may be from 3 nm to 1000 nm, more preferably from 3 nm to 100 nm. In one embodiment, the nanoparticle coating may serve as part, or all, of the gap spacing. This could entail coating the particles with the entire gap thickness desired, thereby reducing the cap layer to zero, or some combination of gap layer thickness plus nanoparticle coating to achieve the desired total spacer thickness. Further, the nanoparticle coating could act as an adhesion layer to improve nanoparticle adhesion to or increase nanoparticle density on the layers onto which they will be deposited. The nanoparticles made be composed of Ag, Al, Ag—Al alloys, Au, Au—Ag alloys, Au—Al alloys. The enhancement layer and/or nanoparticles may be composed of other materials including, but are not limited to Ir, Pt, Ni, Cu, W, Ta, Fe, Cr, Mg, Ga, Rh, Ti, Ca, Ru, Pd, In, Bi. In some cases, the metallic core can be composed of more than one material, such as a Ag sphere that is coated in Rh and then coated with a dielectric material like SiO2.

Figure 10:
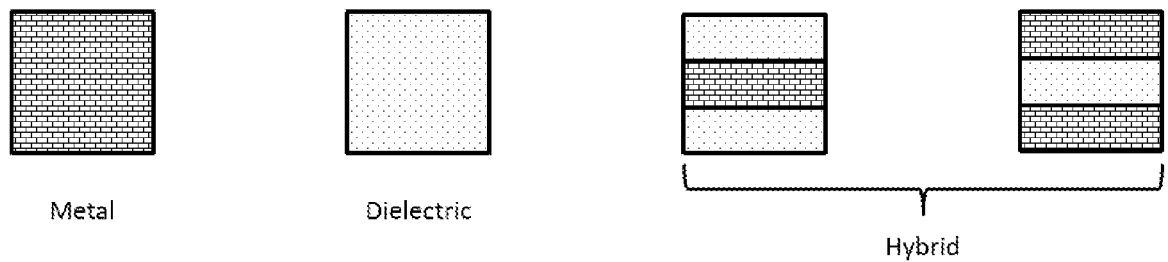
FIG. 10 shows how the material composition of the nano-objects disclosed herein can be metal, dielectric, or some combination (hybrid) of the two.
Figure 11A:
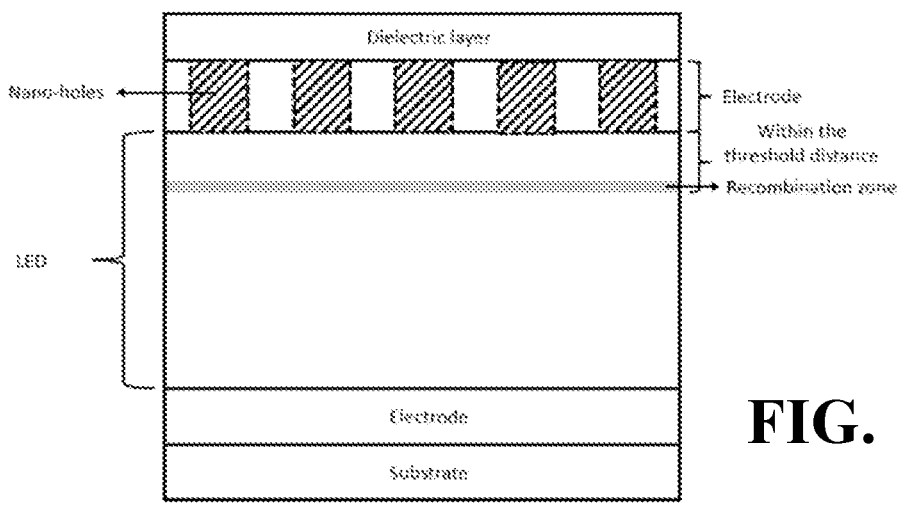
FIGS. 11A-11F schematically depict an example device structures with various nano-structures in the enhancement layer (here, electrode), either with or without a dielectric capping layer as disclosed herein.
Figure 11B:
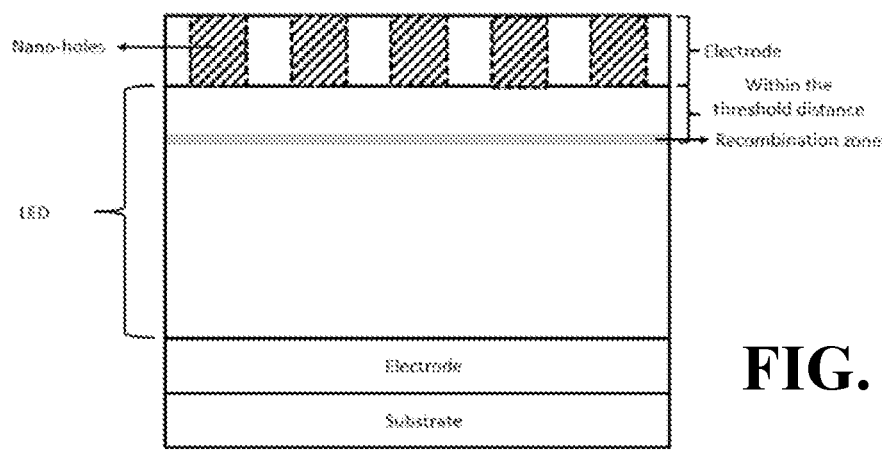
Figure 11C:
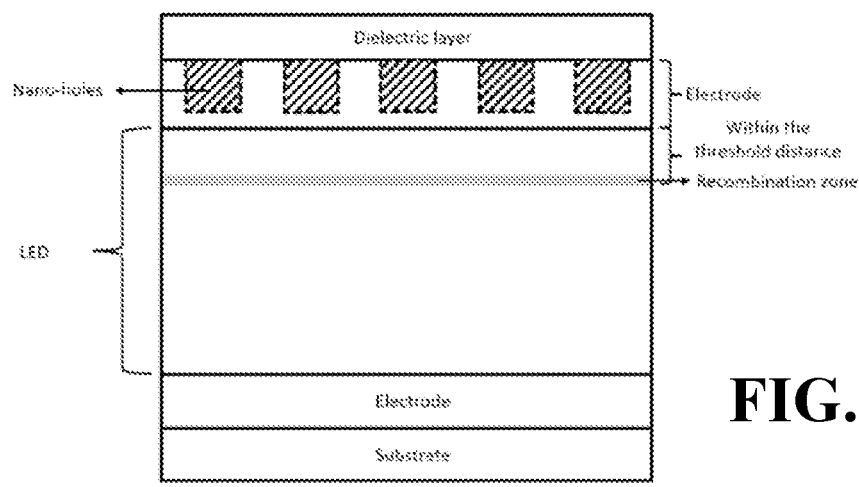
Figure 11D:
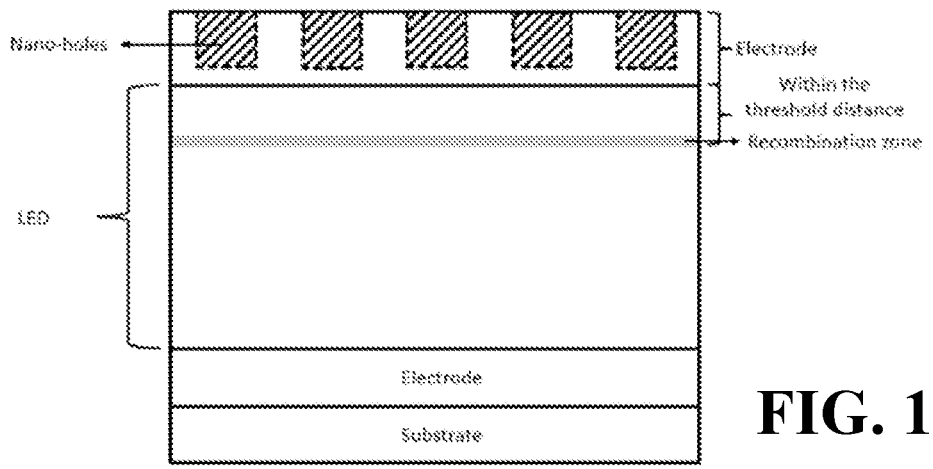
Figure 11E:
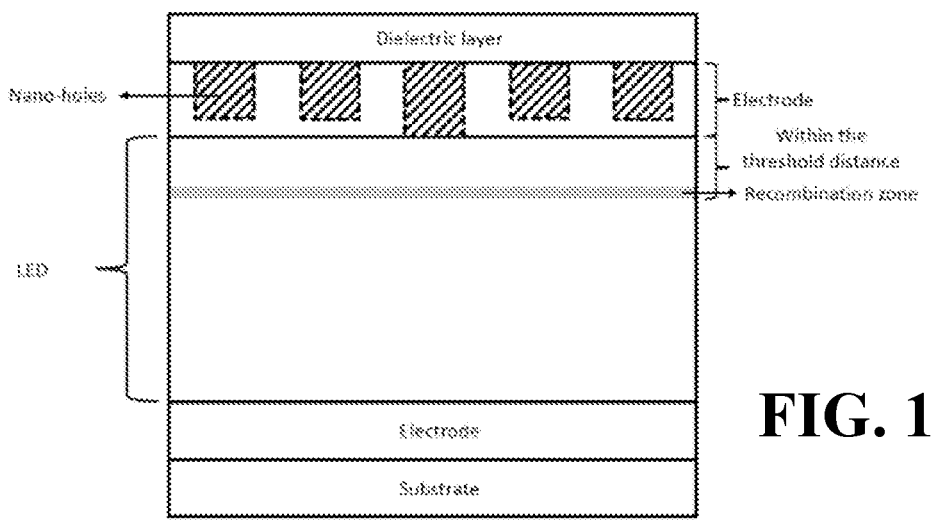
Figure 11F:
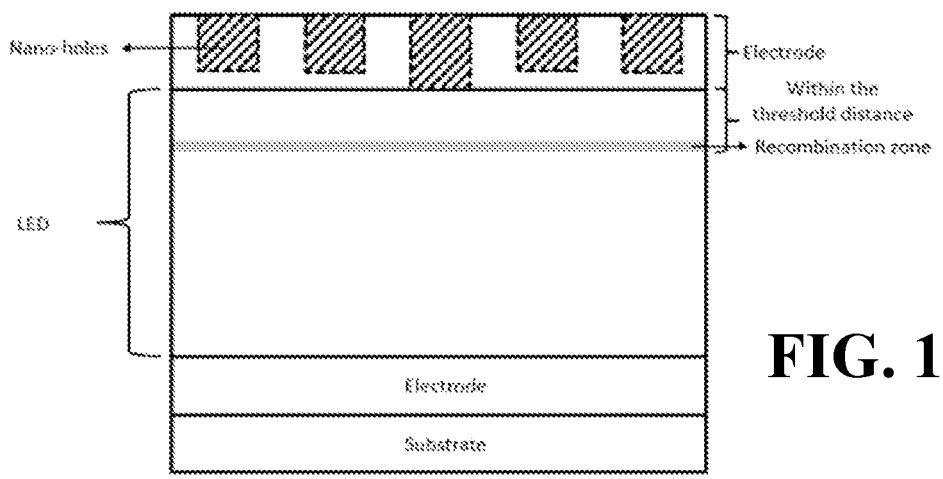
Figure 12:
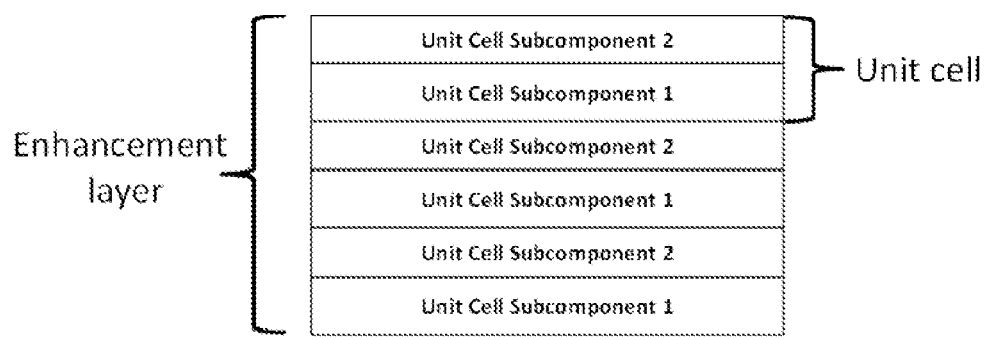
FIG. 12 shows an example enhancement layer composed of 3 unit cells as disclosed herein.

The enhancement layer and/or nanoparticles can include planar metals, stacks of metal layers and dielectric layers, stacks of metal layers and semiconducting layers, and perforated metal layers, as shown in FIGS. 10 and 12. The dielectric materials that are part of the enhancement layer can include but are not limited to oxides, fluorides, nitrides, and amorphous mixtures of materials. The metal layers can include alloys and mixtures of metals from the following: Ag, Au, Al, Zn, Ir, Pt, Ni, Cu, W, Ta, Fe, Cr, Mg, Ga, Rh, Ti, Ca, Ru, Pd, In, Bi. The enhancement layer may be graphene or conductive oxides or conductive nitrides for devices outside the visible range.

In some embodiments the enhancement layer is patterned with nano-sized holes, for example as shown in FIGS. 11A-11F. These holes may be in an array or randomly or pseudo randomly arranged. The size, shape, and orientation of the holes sets the frequency of light that can be outcoupled from the enhancement layer.

In some embodiments, the enhancement layer has a bullseye grating patterned on top of it. In some embodiments, the enhancement layer has a gap and then a bullseye grating patterned on top of the gap material.

In some embodiments the enhancement layer is partially etched through to form nano-size outcoupling features on one side of the enhancement layer. In some embodiments, there are nano-sized features on both sides of the enhancement layer. In some cases when there are nano-sized features on both sides of the enhancement layer, the features smallest dimension will exceed 10 nm, in other cases it will exceed 20 nm, in other cases it will exceed 50 nm.

TABLE 1

Non-limiting examples of potential enhancement layer and/or metal nanoparticle materials and particle size ranges and assuming a dielectric layer between the enhancement layer and metal nano size material with a refractive index of 1.5 and assuming monodisperse monolayer of nanoparticles. Particle sizes are assuming nanocubes, particles with variable length axis may have different ranges.

| $\lambda_{max}$ wavelength [nm] | Potential enhancement layer and/or metal nanoparticle materials | Particle size range |
|---|---|---|
| >760 | Ag, Au, ITO, Si, Ge | 100-250 nm |
| 610 to 760 | Ag, Au, SiO2, Si, Ge | 75-200 nm |
| 590 to 610 | Ag, Au, SiO2, Si, Ge | 60-150 nm |
| 570 to 590 | Ag, Au, SiO2, Si, Ge | 50-100 nm |
| 500 to 570 | Ag, Al, Rh, Pt, SiO2, Si, Ge, TiO2 | 40-125 nm |
| 450 to 500 | Ag, Al, Rh, Pt, TiO2 | 40-125 nm |
| 400 to 450 | Al, Rh, Pt, TiO2 | 50-100 nm |
| <400 | Al, Rh, Pt, TiO2 | 30-75 nm |
| White | Ag, Al, Rh, Pt, TiO2 | 40-125 nm |

When the nanoparticles clump together, the resonance wavelength of outcoupling can increase. For example, large clumps of even UV-resonant particles achieve IR NPA resonances. Thus, considering clumping, we denote some preferred embodiments of LED semiconductor materials and nanoparticle outcoupling material and size distributions.

TABLE 2

Non-limiting examples of potential enhancement layer and/or metal nanoparticle materials and particle size ranges assuming a dielectric layer between the enhancement layer and metal nano size material with a refractive index of 1.5 and allowing for nanoparticle clumping.

| $\lambda_{max}$ wavelength [nm] | Potential enhancement layer and/or metal nanoparticle materials | Particle size range |
|---|---|---|
| >760 | Ag, Au, ITO, Si, Ge, SiO2, Al, Rh, Pt | 5-250 nm |
| 610 to 760 | Ag, Au, SiO2, Al, Rh, Pt, Si, Ge | 5-200 nm |
| 590 to 610 | Ag, Au, SiO2, Al, Rh, Pt, Si, Ge | 5-150 nm |
| 570 to 590 | Ag, Au, SiO2, Al, Rh, Pt, Si, Ge | 5-100 nm |
| 500 to 570 | Ag, Al, Rh, Pt, SiO2, TiO2, Si, Ge | 5-125 nm |
| 450 to 500 | Ag, Al, Rh, Pt, TiO2 | 5-125 nm |
| 400 to 450 | Al, Rh, Pt, TiO2 | 5-100 nm |
| <400 | Al, Rh, Pt, TiO2 | 5-75 nm |
| White | Ag, Al, Rh, Pt, TiO2 | 5-125 nm |

In some embodiments, a consumer electronic device may include a full-color organic light emitting device (OLED) display having a plurality of pixels, with each pixel having a plurality of sub-pixels and where no individual sub-pixel of the plurality of sub-pixels emits white light. The OLED display may be configured to operate with a luminance of at least 1,000 cd/m² at the D65 or higher white point, and using not more than a 0.5 mA/cm² drive current for a blue sub-pixel of the plurality of sub-pixels based on an overall active area of the full-color OLED display.

The consumer electronic device may be a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and/or a sign.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a full-color organic light emitting device (OLED) display comprising a plurality of pixels, with each pixel comprising a plurality of sub-pixels and where no individual sub-pixel of the plurality of sub-pixels emits white light,
   wherein the OLED display is configured to operate with a luminance of at least 1,000 cd/m² at the D65 or higher white point, and using not more than a 0.5 mA/cm² drive current for a blue sub-pixel of the plurality of sub-pixels based on an overall active area of the full-color OLED display, and wherein the full-color OLED display is configured to use not more than a drive current of 0.5 mA/cm², based on the overall active area of the full-color OLED display, divided by N for the blue sub-pixels of the plurality of sub-pixels disposed in a stack arrangement with N emissive layers, to operate with the luminance of the at least 1,000 cd/m² at the D65 or higher white point.

2. The device of claim 1, wherein the OLED display is configured to operate with the luminance of at least 1,000 cd/m² at the D65 or higher white point at a DCI-P3 color gamut, or with greater than 64% of the Rec2020 color gamut.

3. The device of claim 1, wherein the drive current to at least one of the plurality of sub-pixels is pulsed with a duty cycle that is less than 100%.

4. The device of claim 1, wherein the sub-pixels of the OLED display comprise:
   a first blue emissive layer disposed on a second blue emissive layer to form a blue tandem sub-pixel;
   wherein the drive current of the blue tandem sub-pixel is less than 0.25 mA/cm², based on the overall active area of the full-color OLED display, to operate with the luminance of the at least 1,000 cd/m² at the D65 or higher white point.

5. The device of claim 1, wherein the plurality of sub-pixels comprises blue sub-pixels, green sub-pixels, and red subpixels, and
   wherein a first sub-pixel area that includes the blue sub-pixels is larger than at least one selected from the group consisting of: a second sub-pixel area that includes the green sub-pixels, and a third sub-pixel area that includes the red sub-pixels.

6. The device of claim 1, wherein the plurality of sub-pixels comprises blue sub-pixels, green sub-pixels, and red subpixels, and
   wherein a first sub-pixel area that includes the blue sub-pixels is larger than a combination of a second sub-pixel area that includes the green sub-pixels and a third sub-pixel area that includes the red sub-pixels.

7. The device of claim 1, wherein each pixel of the plurality of pixels has no more than three sub-pixels.

8. The device of claim 1, wherein each pixel of the plurality of pixels has more than three sub-pixels.

9. The device of claim 1, wherein the plurality of sub-pixels comprises blue sub-pixels, green sub-pixels, and red sub-pixels, the device further comprising:
a circular polarizer disposed over only the red sub-pixels and the green sub-pixels.

10. The device of claim 9, further comprising:
a color filter disposed over the blue sub-pixels.

11. The device of claim 1, further comprising:
a power supply to provide a pulsed power the OLED display at less than a 100% duty cycle when the OLED display is on.

12. The device of claim 1, wherein a power consumption of the OLED display is less than 9 mW/cm$^2$ at equal or greater to D65 white point at 1,000 nits, excluding a driving circuity power consumption that is external to the active area of the full-color OLED display.

13. The device of claim 1, wherein a blue sub-pixel of the plurality of sub-pixels is shared between at least two pixels of the plurality of pixels.

14. The device of claim 1, wherein at least one pixel of the plurality of pixels of the OLED display comprises:
a first blue sub-pixel disposed on a second blue sub-pixel to form a blue tandem sub-pixel;
a first green sub-pixel disposed on a second green sub-pixel to form a green tandem sub- pixel; and
a first red sub-pixel disposed on a second red sub-pixel to form a red tandem sub-pixel.

15. The device of claim 1, wherein at least the blue sub-pixel is a plasmonic PHOLED (phosphorescent organic light emitting device) blue sub-pixel.

16. The device of claim 1, wherein the device is at least one type selected from the group consisting of: a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

17. A device comprising:
a full-color organic light emitting device (OLED) display comprising a plurality of pixels, with each pixel comprising a plurality of sub-pixels and where no individual sub-pixel of the plurality of sub-pixels emits white light, and wherein at least one sub-pixel of the plurality of sub-pixels includes two or more emissive regions in a stacked arrangement,
wherein the OLED display is configured to operate with power consumption of the OLED display is less than 9 mW/cm$^2$ at equal or greater to D65 white point at 1,000 nits, excluding a driving circuity power consumption that is external to the active area of the full-color OLED display, and
wherein one or more of the following is true:
i) each emissive region of the two or more emissive regions in each sub-pixel of the plurality of sub-pixels emits light of the same color; and
ii) each emissive region of the two or more emissive regions in each sub-pixel of the plurality of sub-pixels comprises an emitter with the same chemical composition.

18. The device of claim 17, wherein the at least one sub-pixel of the plurality of sub-pixels that includes two or more emissive regions in the stacked arrangement comprises:
all of the sub-pixels of the plurality of sub-pixels including the two or more emissive regions in the stacked arrangement.

19. A device comprising:
a full-color organic light emitting device (OLED) display comprising a plurality of pixels, with each pixel comprising a plurality of sub-pixels and where no individual sub-pixel of the plurality of sub-pixels emits white light,
wherein the OLED display is configured to operate with a luminance of at least 1,000 cd/m$^2$ at the D65 or higher white point, and using not more than a 0.5 mA/cm$^2$ drive current for a blue sub-pixel of the plurality of sub-pixels based on an overall active area of the full-color OLED display,
a first global power supply rail configured to provide steady-state power to the OLED display; and
a second global power supply rail configured to provide pulsed power to the OLED display at less than a 100% duty cycle.

20. The device of claim 19, wherein the first global power supply rail provides steady state power to at least one of the plurality of sub-pixels, and the second global power supply rail provides pulsed power to at least another one of the plurality of sub-pixels.

* * * * *